United States Patent
Liu et al.

(10) Patent No.: US 11,999,888 B2
(45) Date of Patent: Jun. 4, 2024

(54) METHOD FOR IN-SITU MODIFICATION OF MERCURY QUANTUM DOTS IN TRADITIONAL THERMAL INJECTION PROCESS

(71) Applicant: SHANGHAI INSTITUTE OF TECHNICAL PHYSICS CHINESE ACADEMY OF SCIENCES, Shanghai (CN)

(72) Inventors: Jingjing Liu, Shanghai (CN); Jianlu Wang, Shanghai (CN); Tianle Guo, Shanghai (CN); Xinning Huang, Shanghai (CN); Xiangjian Meng, Shanghai (CN); Hong Shen, Shanghai (CN); Tie Lin, Shanghai (CN); Junhao Chu, Shanghai (CN)

(73) Assignee: Shanghai Institute of Technical Physics Chinese Academy of Sciences, Shanghai (CN)

( * ) Notice: Subject to any disclaimer, the term of this patent is extended or adjusted under 35 U.S.C. 154(b) by 0 days.

(21) Appl. No.: 18/053,790

(22) Filed: Nov. 9, 2022

(65) Prior Publication Data
US 2023/0174863 A1 Jun. 8, 2023

(51) Int. Cl.
*C09K 11/89* (2006.01)
*B82Y 20/00* (2011.01)
*B82Y 30/00* (2011.01)
*H10K 30/10* (2023.01)

(52) U.S. Cl.
CPC ............ *C09K 11/892* (2013.01); *B82Y 20/00* (2013.01); *B82Y 30/00* (2013.01); *H10K 30/10* (2023.02)

(58) Field of Classification Search
CPC ....... C09K 11/892; B82Y 20/00; B82Y 30/00; H10K 30/10
See application file for complete search history.

(56) References Cited

PUBLICATIONS

Haozhi Zhang and Philippe Guyot-Sionnest, Shape-Controlled HgTe Colloidal Quantum Dots and Reduced Spin-Orbit Splitting in the Tetrahedral Shape, The Journal of Physical Chemistry Letters 2020, 11, 16, 6860-6866 (Year: 2020).*

Sean Keuleyan, Emmanuel Lhuillier, and Philippe Guyot-Sionnest, Synthesis of Colloidal HgTe Quantum Dots for Narrow Mid-IR Emission and Detection,J. Am. Chem. Soc. 2011, 133, 16422-16424 (Year: 2011).*

(Continued)

*Primary Examiner* — Bijan Ahvazi
(74) *Attorney, Agent, or Firm* — Stinson LLP

(57) ABSTRACT

The present disclosure relates to the field of preparation of compound semiconductor nanomaterials, and in particular to a method for in-situ modification of mercury quantum dots in a traditional thermal injection process. It is characterized in that, in the traditional thermal injection process for synthesis of HgTe quantum dots, after a certain reaction time, a low boiling point polar solvent that is incompatible with a reaction solvent is rapidly injected, so that an interfacial separation of two liquid phases occurs in a mixed reaction, and then a selective crystal oriented surface modification is conducted on surfaces of mercury quantum dots.

3 Claims, 5 Drawing Sheets

(56) References Cited

PUBLICATIONS

Yifang Sun, Huidan Zhang, Kai Zhu, Weiguang Ye, Lushuang She, Ximing Gao, Wenyu Ji and Qinghui Zeng, Research on the influence of polar solvents on CsPbBr3 perovskite QDs, RSC Adv., 2021, 11, 27333. (Year: 2021).*

Zekang Liu, Peng Wang, Ran Dong, Wei Gong, Jingjie Li, Dichao Dai, Hui Yan and Yongzhe Zhang, Mid-Infrared HgTe Colloidal Quantum Dots In-Situ Passivated by Iodide, Coatings 2022, 12, 1033, 1-13. (Year: 2022).*

Guohua Shen, Menglu Chen, and Philippe Guyot-Sionnest, Synthesis of Nonaggregating HgTe Colloidal Quantum Dots and the Emergence of Air-Stable n-Doping, J. Phys. Chem. Lett. 2017, 8, 2224-2228. (Year: 2017).*

Chen et al., Size Distribution Effects on Mobility and Intraband Gap of HgSe Quantum Dots; Journal of Physical Chemistry, 2020, vol. 123, No. 29, pp. 16216-16221. Abstract Only.

Livache et al., A colloidal quantum dot infrared photodetector and its use for intraband detection; Nature Communications, 2019, vol. 10, No. 2125, pp. 1-10.

\* cited by examiner

METHOD FOR IN-SITU MODIFICATION OF MERCURY QUANTUM DOTS IN TRADITIONAL THERMAL INJECTION PROCESS

CROSS REFERENCE TO RELATED APPLICATION

The present application claims the benefit and priority of Chinese Patent Application No. 202111324623.0 entitled "Method for in-situ modification of mercury quantum dots in traditional thermal injection process" filed on Nov. 10, 2021, the disclosure of which is incorporated by reference herein in its entirety as part of the present application.

TECHNICAL FIELD

The present disclosure relates to the field of preparation of compound semiconductor nanomaterials, and in particular to a method for in-situ modification of mercury quantum dots in a traditional thermal injection process.

BACKGROUND

In the past two decades, with the rapid development of nanotechnology and material science, hundreds of new low dimensional semiconductor materials have emerged. Among them, due to the unique three-dimensional quantum confinement effect of quantum dot materials, the direct energy band gap can be adjusted by size control. In addition, the quantum dot materials have unique optical, electrical, and magnetic properties, showing great application potential in optoelectronic devices. Due to the fact that mercury telluride (HgTe) bulk materials have special negative band gap structure in the medium wave infrared region, the response wavelength of their corresponding quantum dots can be adjusted from near-infrared region to terahertz region, thus having a wide range of commercial and military applications.

The excellent application potential of mercury telluride quantum dots puts forward high requirements on the quality of its synthesis and preparation. Especially in the fields related to military applications such as infrared photoelectric detection, due to the stringent requirements for their performance, extremely high quality quantum dots are required, such as high size uniformity, extremely low surface defects, and high carrier mobility. At present, there is no report on high size uniformity of the mercury telluride quantum dots synthesized by a solution-operable colloidal chemistry method. For example, HgTe and HgSe colloidal quantum dots reported in [Nature Communications, 2019, 10:2125] and [J. Phys. Chem. C 2020, 124, 29, 16216-16221] have a variance and average deviation of size distribution of greater than 10%. In addition, the surface morphology of the quantum dot is mainly triangular polygon, which is not conducive to long-term ordered dense packing, and ultimately results in reducing the key performance of the quantum dot device, such as mobility and responsiveness.

SUMMARY

In view of this, the present disclosure is to solve the problems of irregular morphology and large size deviation of mercury quantum dots prepared by existing thermal injection synthetic methods, and provide a method for in-situ modification of mercury quantum dots in a traditional thermal injection process. In order to achieve the above object, the present disclosure provides the following technical solutions:

Embodiments of the present disclosure provide a method for in-situ modification of mercury quantum dots in a traditional thermal injection process, comprising:

synthesizing non-spherical HgTe quantum dots in a solution system containing of mercury source, trimethylsilyl tellurium and an amine solvent;

performing a selective crystalline surface modification on the surface of the non-spherical HgTe quantum dots by in situ injection of a polar solvent with low boiling point; wherein the polar solvent is insoluble to the amine solvent.

In some embodiments, the selective crystalline surface modification of the non-spherical HgTe dots by in situ injection of the polar solvent is performed under conditions as follows: when mercury sources, trimethylsilyl tellurium and the amine solvent are mixed and reacted at a temperature of 80-120° C. for 1-20 minutes, the low boiling point polar solvent is injected into the resulting mixed reaction system, and continued to reaction for another 10-60 min.

In some embodiments, the low boiling point polar solvent is one or more selected from the group consisting of methanol, acetonitrile, water, acetone, chloroform, and isopropanol, preferably methanol, but is not limited to this.

Embodiments of the present disclosure also provide quantum dots synthesized by the aforementioned method.

In some embodiments, the quantum dots have a size of 6-13 nm, a variance and average deviation of size distribution of less than 10%, and an absorption cutoff-wavelength of 3-10 The wavelength is adjustable in the medium wave infrared spectrum.

Compared with the prior art, in the present disclosure, during the growth process of the HgTe quantum dots, the polar solvent injected is used to realize an interfacial separation of two liquid phases in the reaction. Through volatilization of the injected low boiling point polar solvent, a surface directional modification is conducted during the growth process, which can avoid the accumulation of excessive trimethylsilyl tellurium on the surface of the quantum dots along the specific crystal orientation, thereby improving the regularity and the quantum efficiency of the quantum dots and reducing the surface defects of the quantum dots. In addition, due to surface directional modification, the produced quantum dots have excellent monodispersity, high size uniformity, and high film mobility.

DETAILED DESCRIPTION OF THE EMBODIMENTS

Figure 1:
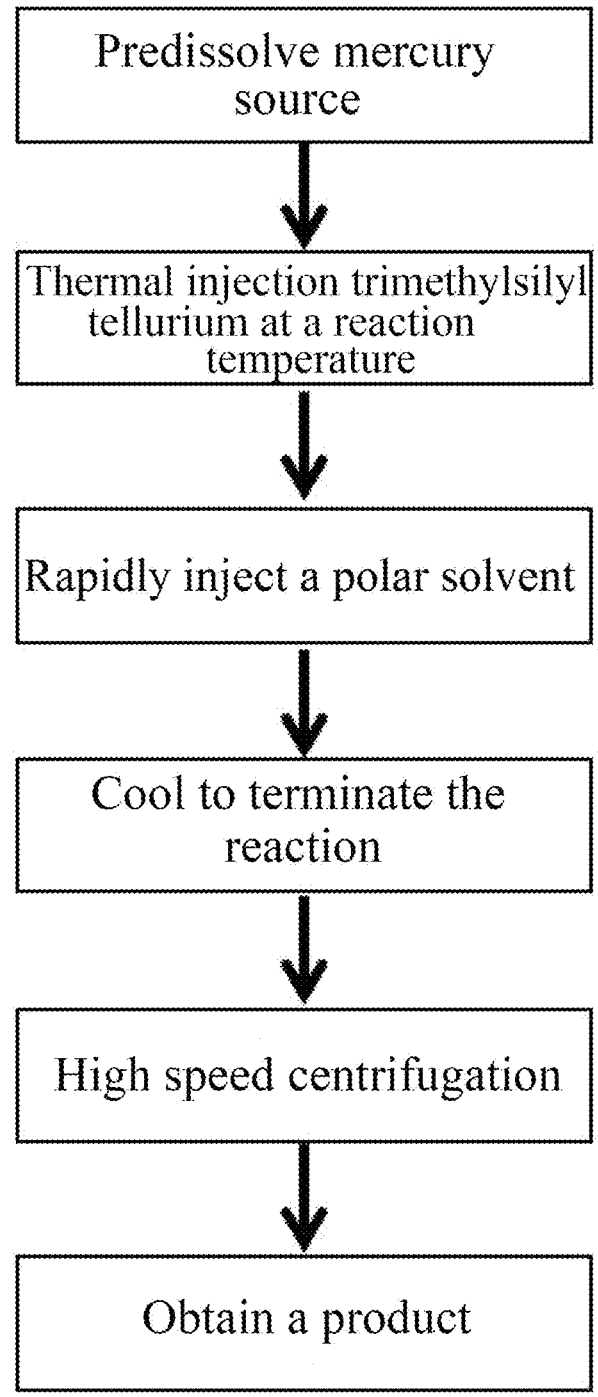
FIG. 1 is a flow chart of a method for in-situ modification of mercury quantum dots in a traditional thermal injection process according to an embodiment of the present disclosure.

In order to make the objects, technical solutions, and advantages of the present disclosure clearer, the present disclosure is further described below in detail with reference to the drawings and embodiments. It should be understood that the specific embodiments described herein are only used to explain the present disclosure, but not to limit the present disclosure. That is, the described embodiments are only some rather than all embodiments of the present disclosure. Generally, components of the embodiments of the present disclosure described and shown in the drawings may be arranged and designed in various configurations. Therefore, the following detailed description of the embodiments of the present disclosure provided in the drawings is not intended to limit the protection scope of the present disclosure, but merely represent selected embodiments of the present disclosure. All other embodiments obtained by those skilled in the art based on the embodiments of the present disclosure without creative effort shall fall within the protection scope of the present disclosure.

Example 1

A method for in-situ modification of HgTe quantum dots based on thermal injection, consisted of the following steps:
Raw Materials:

| | |
|---|---|
| Mercuric chloride (HgCl$_2$) | Sigma Aldrich 99.5% |
| Oleylamine (OAm) | Aladdin 80-90% |
| Trimethylsilyl tellurium (TMS$_2$Te) | Sigma Aldrich 99.5% |

Step I: The above raw materials were placed in a 100 mL three-neck flask and vacuumized. The raw materials were heated to 80° C. until there were no bubbles, and then were heated to 100° C. until mercuric chloride was fully dissolved, to obtain an oleylamine mercuric chloride solution. Then, an argon valve was opened, and the flask was filled with argon.

Step II: The oleylamine mercuric chloride solution obtained in step I was reheated to 100° C., and then a solution of trimethylsilyl tellurium in a solvent n-hexane was rapidly injected into the oleylamine mercuric chloride solution under an argon atmosphere. The resulting mixed system was subjected to a reaction for another 3 minutes.

Step III: Further, after the reaction of the above mixed system was conducted for 1 minute, a low boiling point polar solvent was rapidly injected into the mixed system and stirred, and continued for the reaction.

Step IV: The reactant solution obtained in step III was injected into 8 mL of a trichloroethylene (TCE) solution to terminate the reaction, and the resulting mixed solution was cooled to 0° C. in an ice water mixed solution.

Step V: Anhydrous ethanol was added into the resulting mixed solution in step IV at a volume ratio of (1:2)-(1:10) of the anhydrous ethanol to the resulting mixed solution, and centrifuged at 10,000 rpm for 5 min. A supernatant was discarded after centrifugation to obtain a solution of modified HgTe quantum dots with high-quality.

Example 2

HgTe quantum dots with a diameter of 6.5 nm were prepared by the following steps:
All steps were the same as those in Example 1 except that the temperature in step II was changed to 90° C., and the HgTe quantum dots with the diameter of 6.5 nm were obtained.

Example 3

HgTe quantum dots with a diameter of 13 nm were prepared by the following steps:
All steps were the same as those in Example 1 except that the temperature in step II was changed to 110° C., and the HgTe quantum dots with the diameter of 13 nm were obtained.

Comparative Example 1

All steps were the same as those in Example 1, except that step III (i.e. a low boiling point polar solvent was rapidly injected into the mixed system and stirred) was removed, and finally a solution of HgTe quantum dots was obtained.

The quantum dots as prepared in Example 1 and Comparative Example 1 were characterized.

Figure 2:
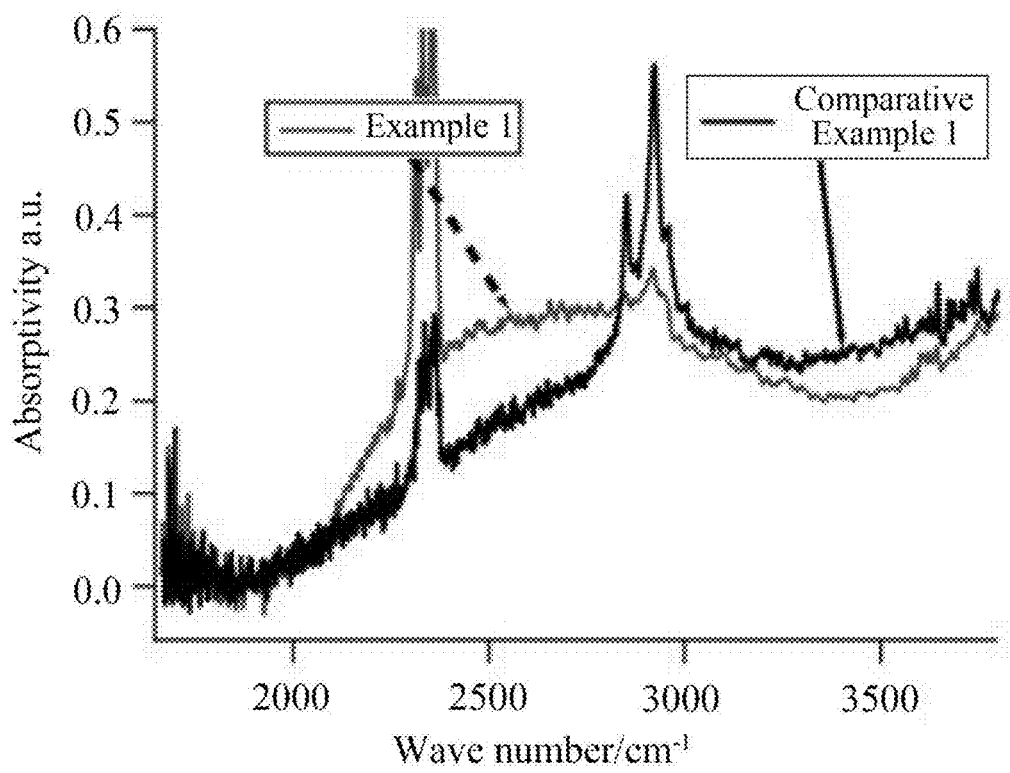
FIG. 2 is a diagram showing absorption spectrums of the HgTe quantum dots obtained by adding a polar solvent into a reaction according to an Example of the present disclosure and the original HgTe quantum dots according to Comparative Example 1.

The solution of modified HgTe quantum dots with high-quality as prepared in Example 1 and the solution of HgTe quantum dots as prepared in Comparative Example 1 were taken and respectively prepared into a film with a thickness of 500 nm by drop coating. Then optical absorption characteristics of the films were measured by a Fourier spectrometer. The results are shown in FIG. 2. From FIG. 2, it can be seen that the quantum dots as prepared in Example 1 have more fine structures visible at ambient temperature, and have more regular morphology and size distribution than those as prepared in Comparative Example 1.

Figure 3A:
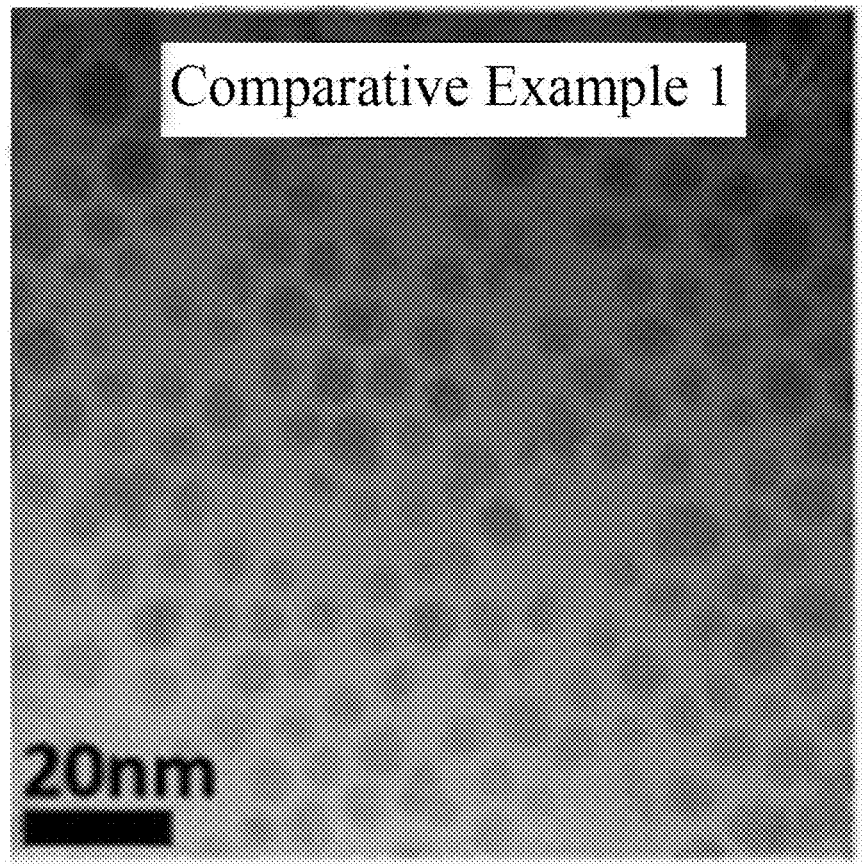
FIG. 3A is a diagram showing transmission electron microscopy (TEM) images of the original HgTe quantum dots according to Comparative Example 1.
Figure 3B:
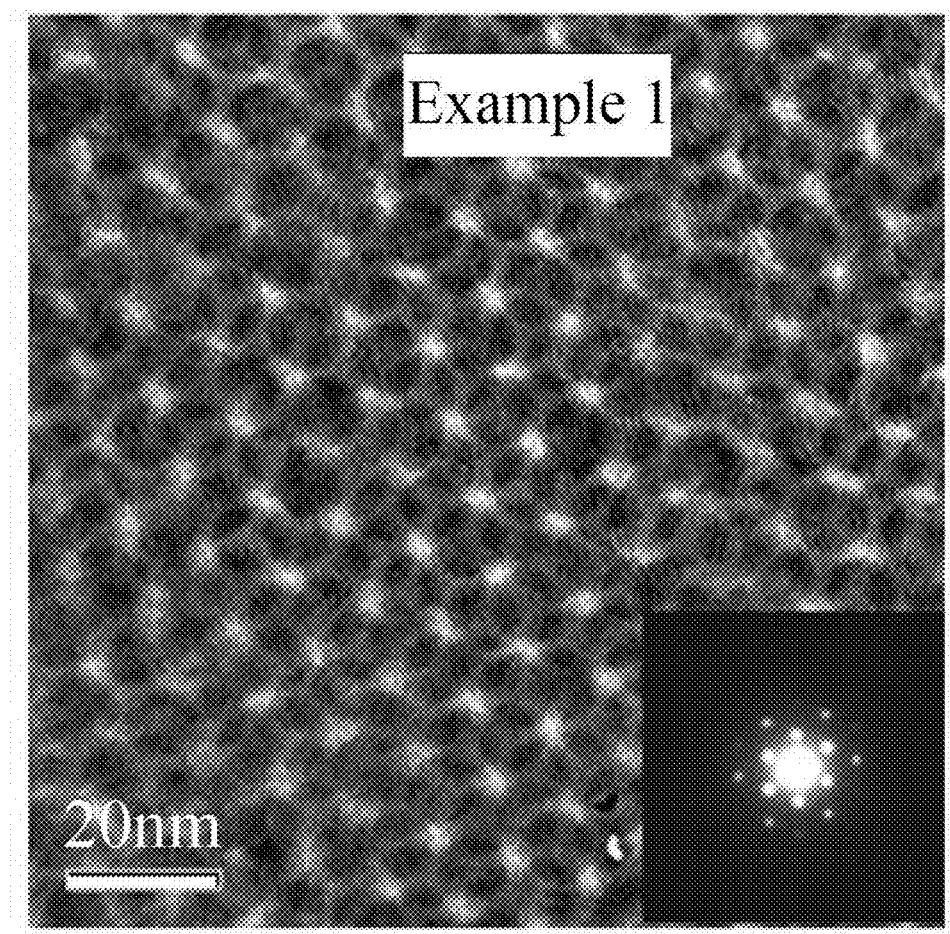
FIG. 3B is a diagram showing transmission electron microscopy (TEM) images of the HgTe quantum dots obtained by adding a polar solvent into a reaction according to an Example of the present disclosure.
Figure 3C:
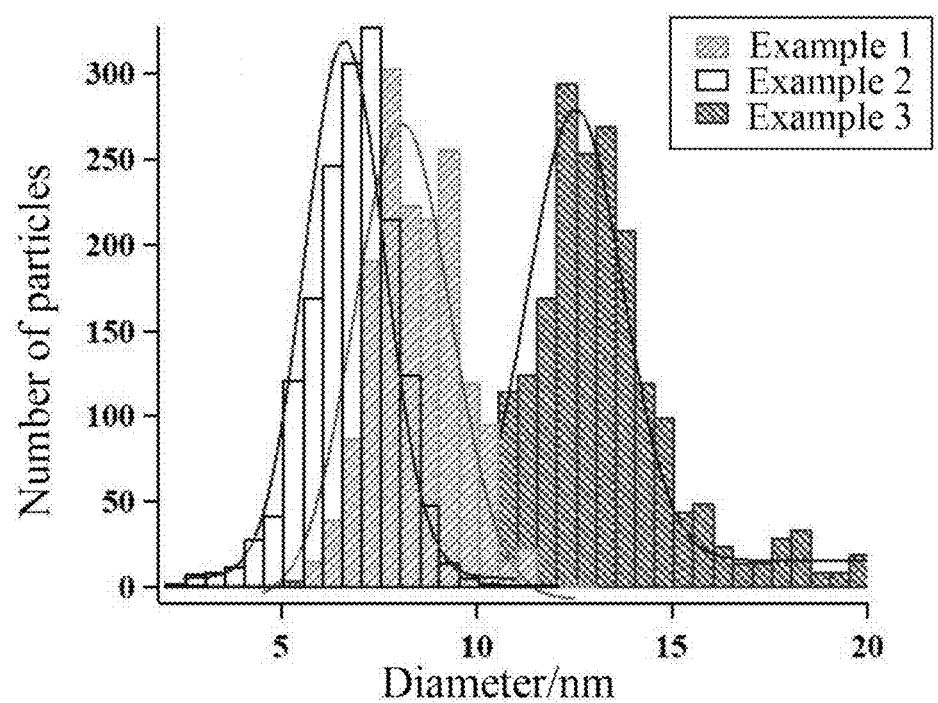
FIG. 3C is a diagram showing size distribution of the HgTe quantum dots obtained by adding a polar solvent into a reaction according to an Example of the present disclosure.

The solution of modified HgTe quantum dots with high-quality as prepared in Example 1 and the solution of HgTe quantum dots as prepared in Comparative Example 1 were taken and respectively dropped on an ultra-thin carbon film copper mesh, dried naturally, and imaged under a high resolution transmission electron microscope. The results are shown in FIG. 3A-3C. From FIG. 3A-3C, it can be seen that the quantum dots as prepared in Example 1 are highly monodisperse, and the variance and average deviation of size distribution are both significantly less than those as prepared in Comparative Example 1.

Figure 4:
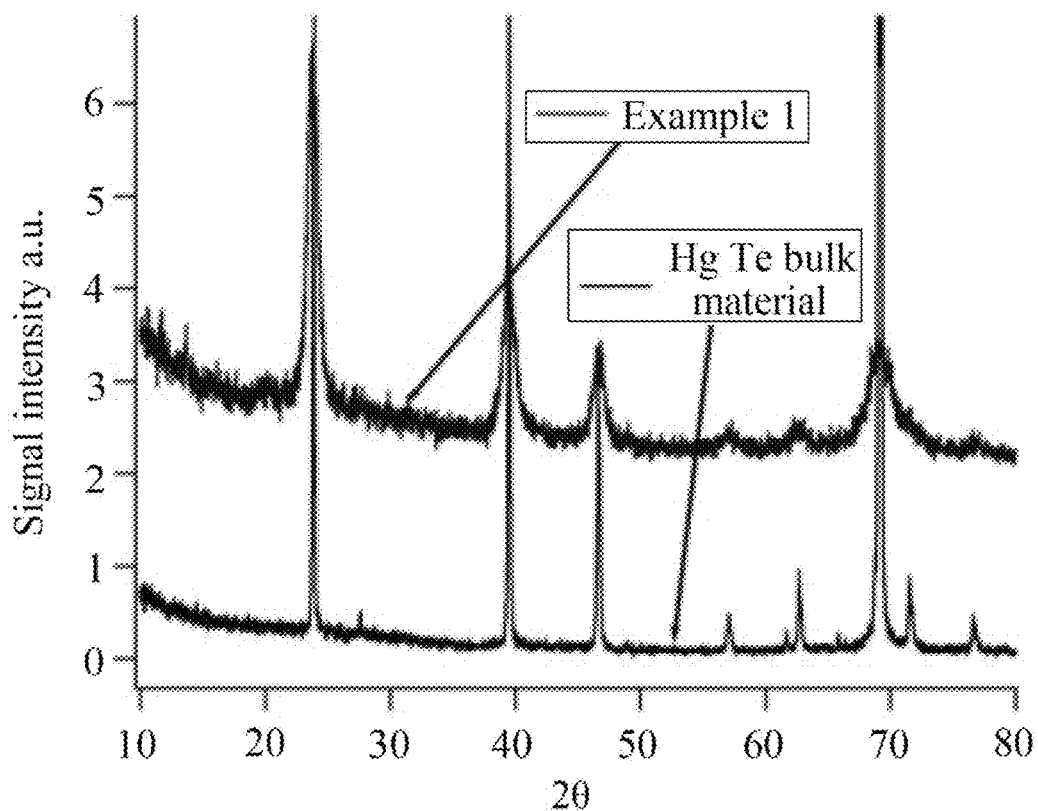
FIG. 4 is a diagram showing an X-ray diffraction (XRD) spectrum of the HgTe quantum dots obtained by adding a polar solvent into a reaction according to an Example of the present disclosure.

A diagram of diffraction of the quantum dots measured by an X-ray diffractometer is shown in FIG. 4. Through analysis and comparison, it can be seen that the mercury telluride HgTe quantum dots were successfully prepared in Example 1.

Example 4

A photoconductive detector in a horizontal structure of HgTe quantum dots with a cut-off wavelength of 5 μm was prepared as follows:

Substrate selection: heavily doped p-type silicon with a thickness of 0.5 mm was selected as the substrate, i.e. a silicon substrate.

Preparation of an oxide dielectric layer: silicon dioxide with a thickness of 285±5 nm was prepared by thermal oxidation on the surface of the silicon substrate.

Preparation of a source and a drain: source and drain interdigital electrode patterns were prepared by electron beam lithography. Metal electrodes were prepared by thermal evaporation, with chromium being 10 nm and gold being 20 nm. Combined with a stripping method, metal films were stripped to obtain the source and drain with a channel width of 10 μm.

Preparation of a quantum dot working film: a solution of modified HgTe quantum dots as prepared in Example 1 was taken and spin coated on the prepared interdigital electrode. After the solvent was volatilized naturally, a ligand exchange was conducted using 1,2-ethanedithiol with a volume percent of 2% to replace a long-chain oleylamine wrapped in the quantum dots. The processes of spin coating and ligand exchange were repeated until the quantum dot working film has a thickness of 100-1,000 nm, preferably 100 nm.

Figure 5A:
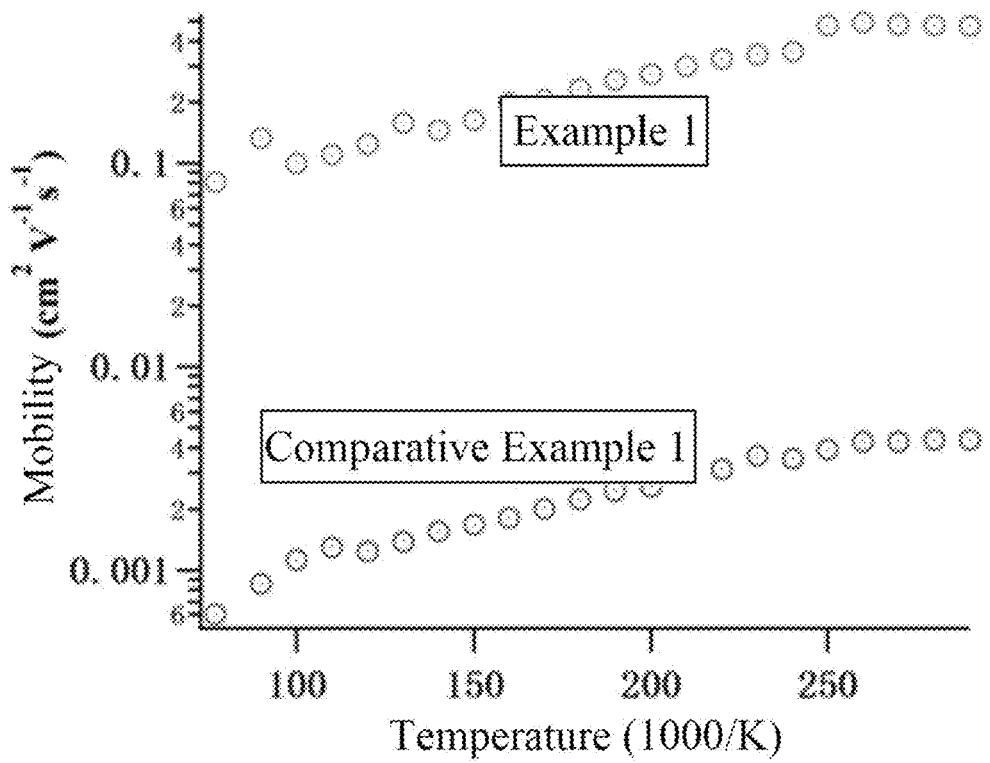
FIG. 5A is a diagram showing mobility vs temperature of the HgTe quantum dots obtained by adding a polar solvent into a reaction according to an Example of the present disclosure and the original HgTe quantum dots according to Comparative Example 1.
Figure 5B:
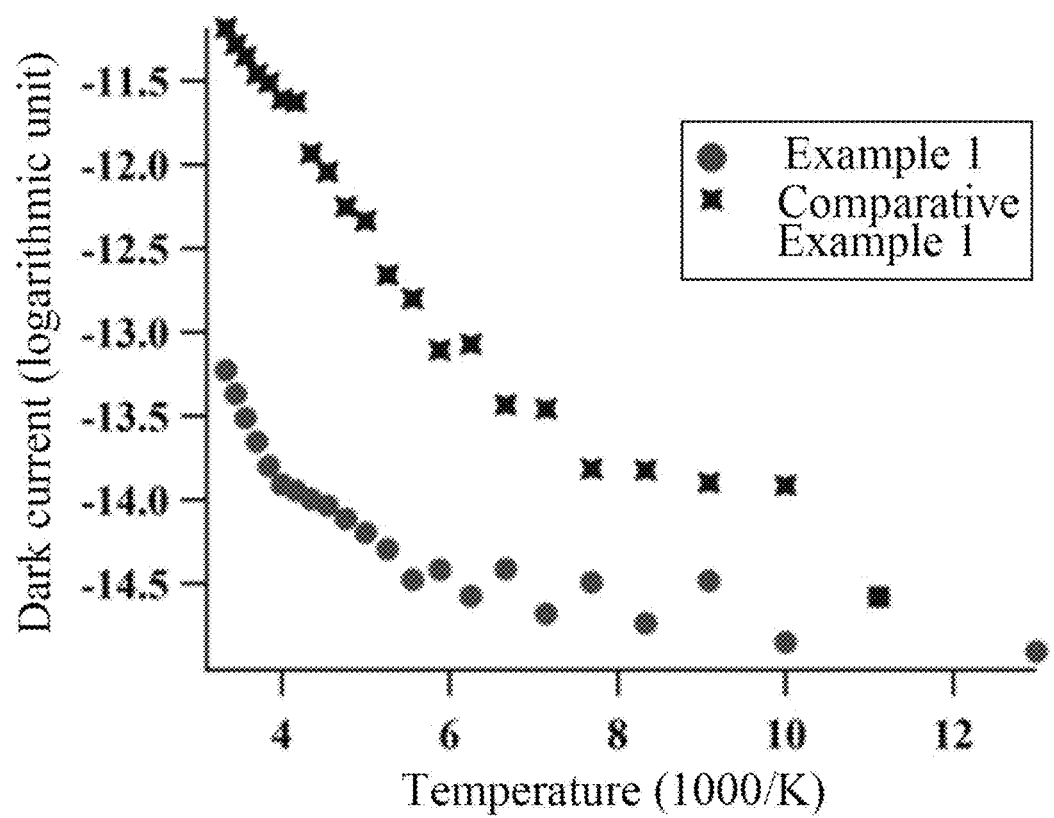
FIG. 5B is a diagram showing dark current vs temperature of the HgTe quantum dots obtained by adding a polar solvent into a reaction according to an Example of the present disclosure and the original HgTe quantum dots according to Comparative Example 1.

Electrical Test of the Quantum Dot Working Film:

A small constant 0.1 V bias voltage was applied between the source and drain to detect a channel current of the HgTe quantum dots under the conditions that a gate voltage had a scanning range of −40 to 40 V and a scanning direction from negative to positive and again to negative. The transfer characteristics of the quantum dot working film were measured under the conditions of darkness and no light on the variable temperature probe station. The electron mobility measured by a field effect transistor (FET) is shown in FIG. 5A. From FIG. 5A, it can be seen that the mobility of the quantum dots as prepared in Example 1 is much higher than that of Comparative Example 1, which is nearly two orders of magnitude higher in numerical value. In addition, from FIG. 5B, it can be seen that the dark current level of the quantum dots as prepared in Example 1 is lower than that of Comparative Example 1 because there are fewer defects in the film.

Photoelectric Test of the Quantum Dot Working Film:

A small constant 0.1 V bias voltage was applied between the source and drain to detect a channel current of the HgTe quantum dots radiated by a 600 K blackbody light source under chopper modulation. The channel current was read out from the signals of the preamplifier (SR570) and lock-in amplifier (SR830). The normalized detection rate under ambient temperature working conditions was $1 \times 10^8$ Jones.

In conclusion, with the above technical solution, the present disclosure can make the growth of the HgTe quantum dots more uniform, and the resulting quantum dots has high size uniformity and excellent monodispersity.

In addition, additional examples have been conducted under the conditions listed in the specification with reference to the ways of Example 1 to Example 3 by the inventor of the present disclosure, and HgTe quantum dots with different cut-off wavelengths and high size uniformity and monodispersity were prepared.

It should be understood that the above examples are only intended to illustrate the technical conception and characteristics of the present disclosure, so that those skilled in the art could understand the content of the present disclosure and apply the content accordingly, and the protection scope of the present disclosure should not be limited thereby. For example, the parts not mentioned in the specification could be realized by adopting or referring to the existing technology. Therefore, any equivalent changes or modifications made according to the spirit of the present disclosure should fall within the protection scope of the present disclosure.

What is claimed is:

1. A method for in-situ modification of mercury quantum dots in a traditional thermal injection process, comprising:
    step I: preparing a precursor solution: mixing a mercury halide and an oleylamine to obtain a mixed system, heating the mixed system to 100° C., and fully stirring to form a precursor solution;
    step II: rapidly injecting trimethylsilyl tellurium into the precursor solution and reacting at a reaction temperature of 80-120° ° C. to obtain a mixed reaction system, wherein a molar ratio of tellurium, mercury, and oleylamine is 0.5:1:48;
    step III: during reacting the trimethylsilyl tellurium and the precursor solution, injecting a polar solvent into the mixed reaction system, and performing an in-situ surface modification of quantum dots in a two-phase dynamic interface; and
    step IV: cooling the mixed reaction system, and conducting separation and purification to obtain a medium wave infrared mercury quantum dot solution;
    wherein the polar solvent in step III comprises one or more selected from the group consisting of methanol, acetonitrile, water, acetone, chloroform, and isopropanol.

2. The method of claim 1, wherein the mercury halide in step I is one or more in any proportion selected from the group consisting of mercuric chloride, mercuric bromide, and mercuric iodide, and the mercury has a molar concentration of 0.03-0.1 mol/L.

3. The method of claim 1, wherein the volume ratio of the polar solvent to the amine solvent in step III is 1:4.

* * * * *